United States Patent
Kubo

(10) Patent No.: US 7,656,022 B2
(45) Date of Patent: Feb. 2, 2010

(54) WIRING BOARD AND MANUFACTURING METHOD FOR WIRING BOARD

(75) Inventor: Tomoyuki Kubo, Nagoya (JP)

(73) Assignee: Brother Kogyo Kabushiki Kaisha, Nagoya-shi, Aichi-ken (JP)

(*) Notice: Subject to any disclaimer, the term of this patent is extended or adjusted under 35 U.S.C. 154(b) by 538 days.

(21) Appl. No.: 11/488,185

(22) Filed: Jul. 18, 2006

(65) Prior Publication Data

US 2007/0017694 A1 Jan. 25, 2007

(30) Foreign Application Priority Data

Jul. 20, 2005 (JP) .............................. 2005-210469

(51) Int. Cl.
*H01L 23/053* (2006.01)
*H01L 23/48* (2006.01)

(52) U.S. Cl. .................. 257/701; 257/737; 257/773; 257/786; 257/779; 257/E23.02

(58) Field of Classification Search .................. 257/701, 257/773, 786, 737, E23.02
See application file for complete search history.

(56) References Cited

U.S. PATENT DOCUMENTS 5,637,920 A * 6/1997 Loo ............................ 257/700
6,037,654 A * 3/2000 Tamura ....................... 257/668
6,137,185 A * 10/2000 Ishino et al. ................ 257/786
6,534,852 B1 * 3/2003 Lin et al. ..................... 257/691
6,608,379 B2 * 8/2003 Yeo et al. .................... 257/706
6,919,515 B2 * 7/2005 Blackshear et al. ......... 174/260
7,268,303 B2 * 9/2007 Ashida ........................ 174/260
2004/0060969 A1 4/2004 Imai et al.

FOREIGN PATENT DOCUMENTS

| JP | 3327332 | 7/2002 |
|---|---|---|
| JP | 2004114609 | 4/2004 |
| JP | 2005212238 | 8/2005 |

* cited by examiner

*Primary Examiner*—Nitin Parekh
(74) *Attorney, Agent, or Firm*—Baker Botts, LLP

(57) ABSTRACT

A wiring board is provided, where in the case where the wiring board and a piezoelectric element are connected via solder, the strength of connection in the peripheral region of the wiring board can be increased, and it is difficult for a connection defect to occur in the step of connecting the wiring board to the piezoelectric element. In addition, a manufacturing method for this wiring board is provided. The area of attaching portions 27b provided in the peripheral region of an insulating film 20 is made greater than that of attaching portions 27a provided in the inward region. In addition, the thickness of solder bumps 25b which are formed by providing solder to attaching portions 27b is made substantially the same as the thickness of solder bumps 25a which are formed by providing solder to attaching portions 27a.

9 Claims, 12 Drawing Sheets

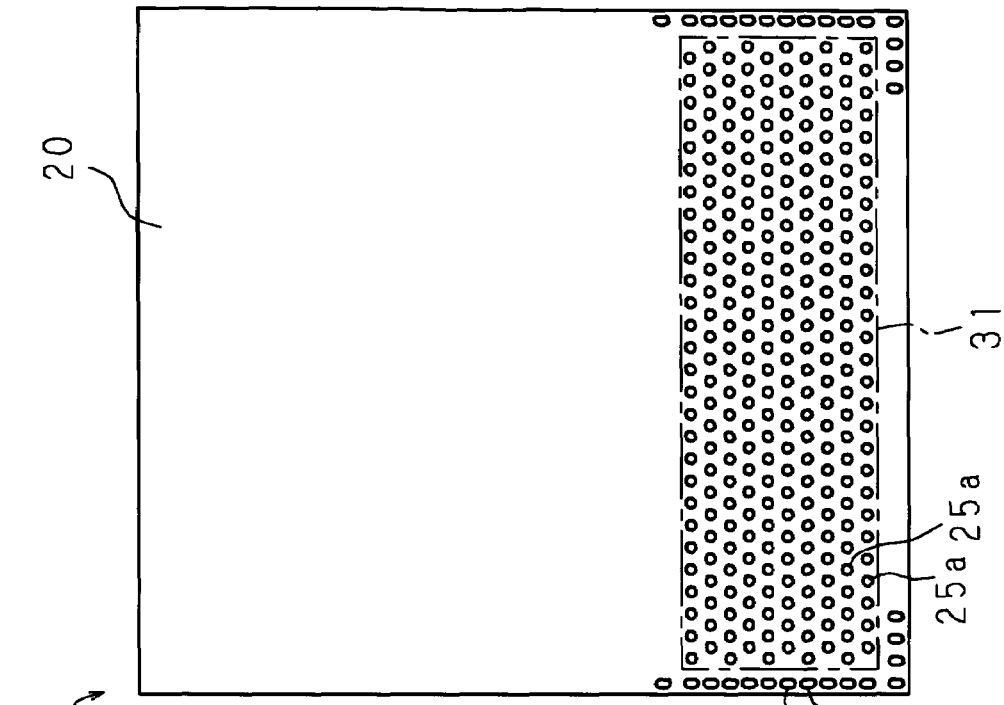
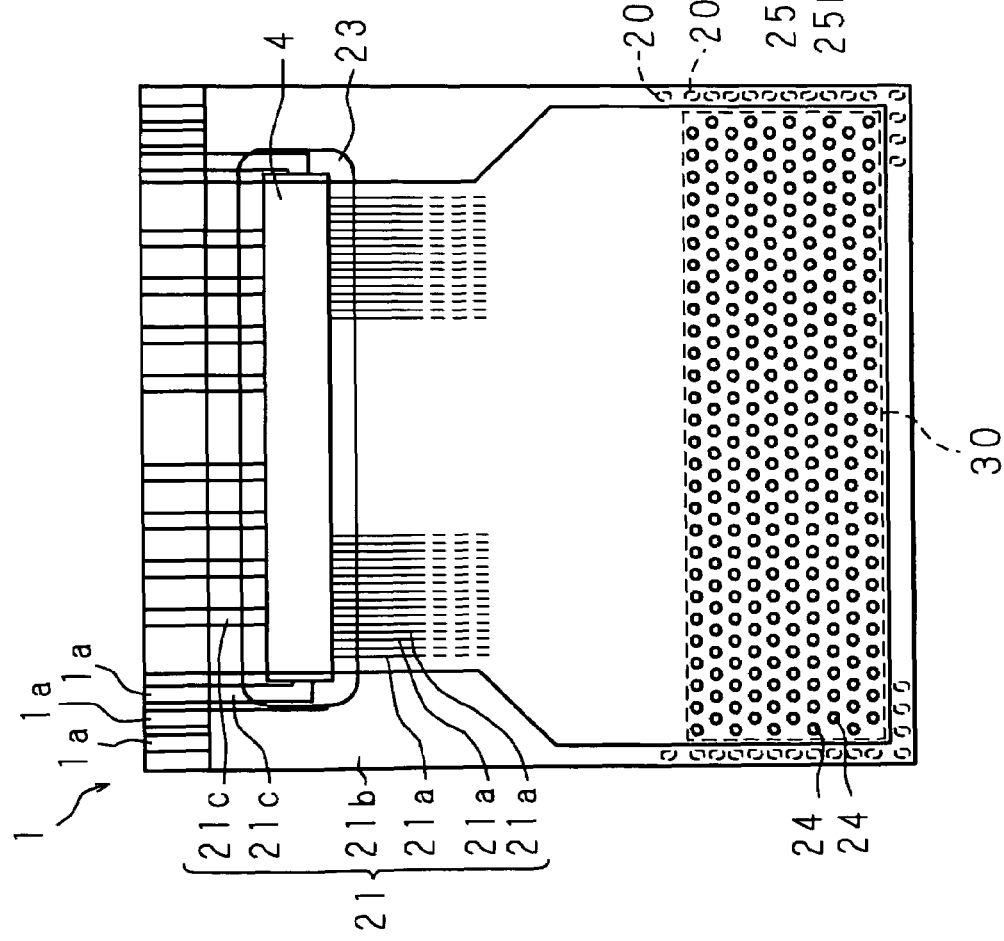

F I G. 7A 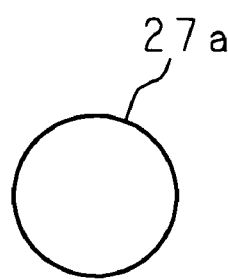 
F I G. 7B 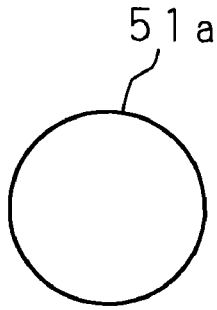 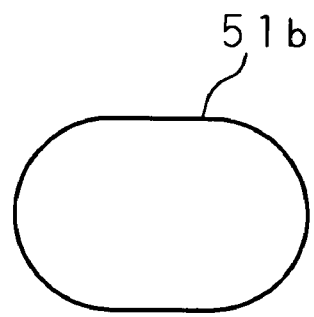

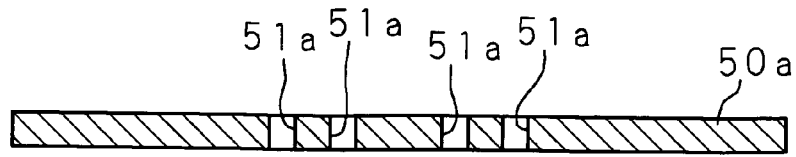
FIG. 11F
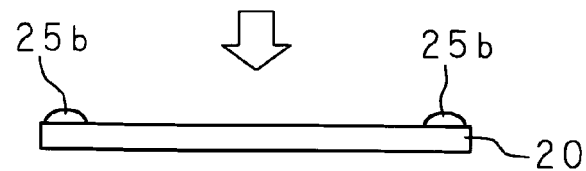
FIG. 11G
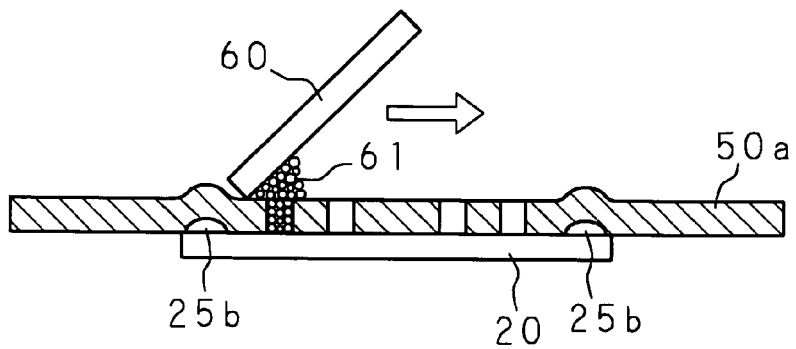
FIG. 11H
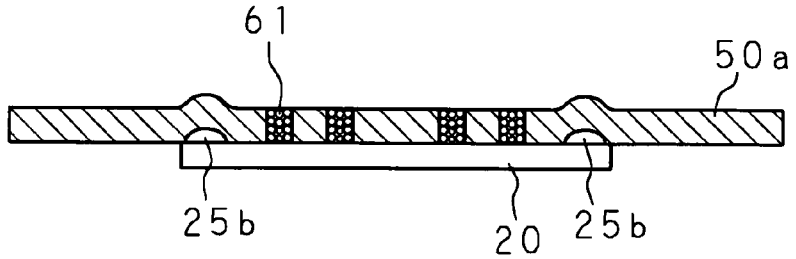
FIG. 11I
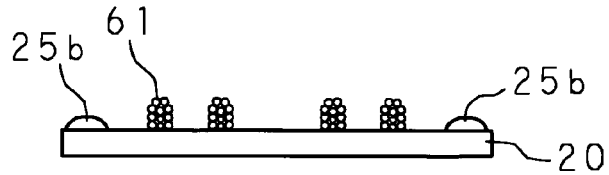
FIG. 11J
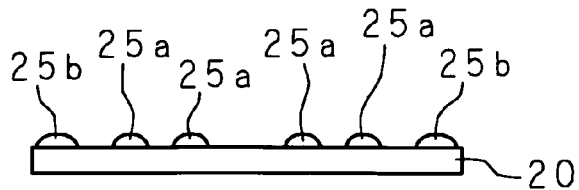

WIRING BOARD AND MANUFACTURING METHOD FOR WIRING BOARD

CROSS-REFERENCE OF RELATED APPLICATION

This non-provisional application claims priority under 35 U.S.C. §119(a) on Patent Application No. 2005-210469 in Japan on Jul. 20, 2005, the entire contents of which are hereby incorporated by reference.

BACKGROUND

The present invention relates to a wiring board where a plurality of bumps are formed of conductive brazing material on an insulting film, as well as a manufacturing method for a wiring board.

Inkjet printers carry out color printing using a plurality of ink cartridges having colors such as cyan, magenta, yellow and black. Inks which are supplied from the ink cartridges are jetted from a plurality of discharging openings which are formed in an inkjet head by means of pressure applied by a piezoelectric element. The piezoelectric element has a plurality of individual terminals for applying a drive voltage corresponding to the ink discharging openings. A drive voltage is applied to each of the individual terminals from a driving IC via a flexible wiring board which is connected to the piezoelectric element. A flexible wiring board is used to convey a drive voltage, a control signal and the like, and thereby, flexibility in mounting can increase when the inkjet head is mounted on the inkjet printer. In addition, the inkjet printer can be miniaturized.

A plurality of solder bumps are provided on one surface (a surface for connection with the piezoelectric element) of the flexible wiring board such that terminals of the piezoelectric element correspond in position. The solder bumps on the flexible board and the terminals of the piezoelectric element are press bonded with heating, such that the flexible board and the piezoelectric element are electrically connected. The solder bumps are formed by providing solder to wires (terminal lands) of the flexible wiring board. The solder bumps are formed in accordance with a method having, for example, the following steps: (i) a mask for the formation of solder bumps is made to make contact with a flexible wiring board; (ii) cream solder that has been applied on the mask is wiped off using a squeegee; (iii) the cream solder with which the openings in the mask are filled in is transferred to the flexible wiring board when the cream solder is wiped off, (iv) the cream solder is heated and melted in a reflow furnace. As a result, solder is provided to the terminal lands of the wires.

The structure of connection on the flexible wiring board described in Japanese Patent Application Laid-Open No. 2004-114609 is formed in accordance with a method having the following steps: (i) a line of a plurality of terminal lands is provided to an insulator in band form; (ii) through holes are created in the insulator so as to correspond to locations where terminal lands are provided, such that the terminal lands are exposed from the surface of the insulator opposite to the side on which the terminal lands are provided; (iii) solder is provided to the exposed terminal lands, such that solder bumps are formed; (iv) the terminals of the piezoelectric element and the terminal lands are connected via the solder bumps.

BRIEF SUMMARY

The areas of the solder bumps provided to a conventional flexible wiring board are approximately the same. This is because the solder bumps are formed in accordance with a printing method using a printing paste. The printing paste is a coating agent for printing in cream form where a solvent, a thickening agent and an activating agent are added to solder powder having a predetermined particle diameter. When the cream solder is provided to the terminal lands of the flexible wiring board, the cream solder is applied through a mask while being pressed with a squeegee. The penetrating properties (amount of application) of the cream solder are affected by the area of the openings in the mask. In the case where solder bumps having different areas are formed, the smaller the area is, the thinner the solder tends to be. Therefore, a situation of connection between the flexible wiring board and the piezoelectric element becomes uneven, and there becomes a risk that a connection defect may occur. The reason for providing approximately the same solder bumps in area in the conventional flexible wiring board is to avoid this.

In addition, flexible wiring boards are often mounted in an inkjet printer with the boards bent after connection between the piezoelectric element and the driving IC or the like. In the case where a flexible wiring board is bent during the manufacturing process, or in the case where a flexible wiring board is mounted in an inkjet printer, stress is caused by bending in the connection sections between the piezoelectric element and the flexible wiring board. This may cause breakage of the connection sections. Peripheral portions of the piezoelectric element tend to be bent by the stress, and-therefore; the breakage of the connection sections tends to take place, starting from these peripheral portions.

The present invention is provided in view of this situation, and an object thereof is to provide a wiring board where the strength of connection in connection sections in the periphery in which stress is easily caused by bending can be increased when a flexible wiring board and a piezoelectric element are connected through soldering.

Another object of the present invention is to provide a wiring board where it is difficult for a connection defect to occur during the process of connection of a piezoelectric element during the manufacture of an inkjet head, irrespectively of the area of attaching portions to which solder is attached.

Still another object of the present invention is to provide a wiring board where the strength of connection can be increased at four corners of a piezoelectric element, where breakage of the connection between an insulating film and the piezoelectric element tend to take place.

Yet another object of the present invention is to provide a wiring board having a attaching portion where the strength of connection against force that is applied from the outside can be enhanced.

Still yet another object of the present invention is to provide a manufacturing method for a wiring board where the thickness of solder bumps which are formed after melting solder in particle form can be made substantially uniform between the periphery (peripheral region) of an insulating film and the center (inward region), where the areas of the attaching portions to which solder is attached differ.

Another object of the present invention is to provide a manufacturing method for a wiring board where excessive solder can be prevented from being provided in attaching portions having a large area.

According to the first aspect of the present invention, there is provided a wiring board a wiring board, comprising: an insulating film; a plurality of wires which are provided on one surface of the insulating film; and a plurality of through holes which are created in the above described insulating film, wherein a portion of each wire is exposed from the other surface of the insulating film through the above described through holes, portions of the wires which are exposed through the above described through holes are portions for providing a conductive brazing material, the portions are provided in a peripheral region of the insulating film and in an inward region of the insulating film, and the area of the portions which are provided in the peripheral region of the above described insulating film is greater than the area of the portions which are provided in the inward region of the above described insulating film.

According to the second aspect of the present invention, there is provided a wiring board, comprising: an insulating film; a plurality of wires which are provided on one surface of the insulating film; and a plurality of portions for providing a conductive brazing material which are provided on the surface of the above described insulating film, wherein a terminal land is formed for each wire, each portion makes up a terminal land, the above described portions are provided in a peripheral region of the insulating film and in an inward region of the insulating film, and the area of the portions which are provided in the peripheral region of the above described insulating film is greater than the area of the portions which are provided in the inward region of the above described insulating film.

In the present invention, the area of attaching portions which are provided in the peripheral region of the insulating film is greater than that in the inward region. As a result, the size of the solder bumps for the connection with a piezoelectric element is large, making the strength of connection of the attaching portion for connection with a piezoelectric element increase.

According to the third aspect of the present invention, there is provided a wiring board, wherein the thickness of the conductive brazing material which is provided in the portions in the peripheral region of the above described insulating film is approximately the same as the thickness of the conductive brazing material which is provided in the portions in the inward region of the above described insulating film.

In the present invention, in the case where the area of attaching portions in the peripheral region of the insulating film is increased, the thickness of the solder of the attaching portion in the peripheral region is made substantially same as the attaching portions in other regions. As a result, it is difficult for the situation of connection between the solder bumps of the wiring board and the terminals of a piezoelectric element to become uneven.

According to the fourth aspect of the present invention, there is provided a wiring board, wherein an approximately rectangular region where a plurality of circular portions are provided is formed in the inward region of the above described insulating film, wires in the above described insulating film extend so as to cross one side of the above described approximately rectangular region, and at least two lines of a plurality of elliptical portions are provided parallel to each other in the direction in which wires on the above described insulating film extend at a location adjacent to the four corners of the above described approximately rectangular region, which surrounds the above described approximately rectangular region from the outside in the peripheral region of the above described insulating film.

In the present invention, attaching portions having a large area are provided in the vicinity of at least four corners in the periphery of an substantially rectangular region which includes a plurality of portions. As a result, the strength of connection in the four corners to which an external force which might break the connection between the insulating film and the piezoelectric element is easily applied is increased. In addition, attaching portions in the peripheral region are elliptical with a long axis directed in the direction in, which wires on the insulating film extend. As a result, the strength against external force which is applied when the wiring board is bent so as to be mounted in an inkjet head between the portion for connection of a driving IC and the portion for connection of a piezoelectric element is increased.

According to the fifth aspect of the present invention, there is provided a manufacturing method for a wiring board, in which the wiring board includes a plurality of portions for providing a conductive brazing material which are provided in an insulating film and a conductive brazing material which is provided in the portions, the area of portions which are provided in a peripheral region of the insulating film being greater than the area of portions which are provided in an inward region of the insulating film, the above described manufacturing method comprising steps of making a mask where openings are created at locations which correspond to the portions of the above described insulating film make contact with the surface of the above described insulating film where the portions are provided, the area of the openings which correspond to the portions provided in the peripheral region of the above described insulating film being smaller than the area of the portions which are provided in the peripheral region of the above described insulating film; providing a conductive brazing material from the openings in the above described mask to the corresponding portions of the above described insulating film by applying a coating material which includes a conductive brazing material in particle form to the, above described mask and wiping off the above described applied coating material while pressing; and heating and melting all of the conductive brazing material which is provided in the portions of the above described insulating film.

In the present invention, in-the case where solder bumps are formed on a wiring board, solder in particle form which has been applied to a mask is pressed with a squeegee so as to be provided to the attaching portions, and after that, the solder in particle form is melted in a reflow furnace, and thus, solder bumps are formed. Solder is provided in attaching portions in the peripheral region using a mask where the area of the openings which corresponds to the attaching portions in the peripheral region is smaller than that of the attaching portions in the peripheral region. Accordingly, the area occupied by the solder in particle form that is provided to the attaching portions in the peripheral region using a squeegee is small. In addition, the thickness of the solder bumps which are formed throughout the entirety of the attaching portions after the solder in particle form has been melted is less than the thickness of the solder in particle form when the solder is provided.

According to the sixth aspect of the present invention, there is provided a manufacturing method for a wiring board, wherein in the step of making the above described mask make contact with the surface of the above described insulating film on which the portions are provided; the above described openings in the above described insulating film which correspond to the portions which are provided in the inward region are in taper form with a diameter that expands toward the side that makes contact with the above described insulating film.

According to the present invention, in the case where solder bumps are formed on a wiring board, solder in particle form which has been applied to a mask is pressed with a squeegee so as to be provided to the attaching portions, and after that, the solder in particle form is melted in a reflow furnace, and thus, solder bumps are formed. Solder is provided to attaching portions in an inward region using a mask where the openings which correspond to attaching portions in the inward region are in taper form with a diameter that expands toward the side that makes contact with the wiring board. Accordingly, the penetrating properties of the solder in particle form are excellent for the attaching portions in the inward region. In addition, it is difficult for the thickness of solder bumps which are formed after the solder in particle form is melted to change as compared to the thickness of the solder in particle form when the solder is provided.

According to the seventh aspect of the present invention, there is provided a manufacturing method for a wiring board, in which the wiring board includes a plurality of portions for providing a conductive brazing material which are provided in an insulating film and a conductive brazing material which is provided in the portions, the area of portions which are provided in a peripheral region of the insulating film being greater than the area of portions which are provided in an inward region of the insulating film, the above described manufacturing method comprising steps of making a mask where openings are created at locations which correspond to the portions of the above described insulating film make contact with the surface of the above described insulating film where the portions are provided; providing a conductive brazing material from the openings of the above described mask to the portions in an inward region of the above described insulating film by applying a coating material which includes a conductive brazing material in particle form to the above described mask and wiping off the above described applied coating material while pressing with first pressure; providing a conductive brazing material from the openings of the above described mask to portions in a peripheral region of the above described insulating film by applying a coating material to the above described mask and wiping off the above described applied coating material while pressing with second pressure; and heating and melting all of the conductive brazing material that is provided in the portions of the above described insulating film, wherein in the two steps of providing a conductive brazing material to the above described portions, the above described first pressure is greater than the above described second pressure.

In the present invention, in the case where solder bumps are formed on a wiring board, solder in particle form which has been applied to a mask is pressed with a squeegee so as to be provided to the attaching portions, and after that, the solder in particle form is melted in a reflow furnace, and thus, solder bumps are formed. When the solder is pressed; with a squeegee, a small pressing force is applied in the peripheral region and a large pressing force is applied in the inward region. Accordingly, the amount of solder that passes through the openings of the mask is adjusted. That is to say, in the inward region, where it is generally difficult for solder to pass through the openings in the mask, passing of solder through the openings is facilitated, while in the peripheral portion, where it is generally easy for solder to pass through the openings in the mask, passing of solder through the openings is restricted.

According to the eighth aspect of the present invention, there is provided a manufacturing method for a wiring board, in which the wiring board includes a plurality of portions for providing a conductive brazing material which are provided in an insulating film and a conductive brazing material which is provided in the portions, the area of portions which are provided in a peripheral region of the insulating film being greater than the area of portions which are provided in an inward region of the insulating film, the above described manufacturing method comprising steps of: making a mask where openings are created at locations which correspond to the portions of the above described insulating film make contact with the surface of the above described insulating film where the portions are provided; providing a conductive brazing material from the openings of the above described mask to the portions in an inward region of the above described insulating film by applying a first coating material which includes a conductive brazing material in particle form having a first particle diameter to the above described mask and wiping off the above described first applied coating material while pressing; providing a conductive brazing material from the openings of the above described mask to portions in a peripheral region of the above described insulating film by applying a second coating material which includes a conductive brazing material in particle form having a second particle diameter to the above described mask and wiping off the above described second applied coating material while pressing; and heating and melting all of the conductive brazing material that is provided in the above described portions, wherein in the two steps of providing a conductive brazing material to the above described portions, the above described first particle diameter is smaller than the above described second particle diameter.

In the present invention, in the case where solder bumps are formed on a wiring board, solder in particle form which has been applied to a mask is pressed with a squeegee so as to be provided to the attaching portions, and after that, the solder in particle form is melted in a reflow furnace, and thus, solder bumps are formed. The size of the particles of solder that is provided in attaching portions in the peripheral region is greater than the size of the particles of solder that is provided in attaching portions in the inward region. Accordingly, when solder in particle form is provided using a squeegee, it becomes difficult for the solder to pass through the openings in the mask in attaching portions in the peripheral region, while it becomes easy for the solder to pass through the openings in the mask in attaching portions in the inward region.

According to the ninth aspect of the present invention, there is provided a manufacturing method for a wiring board, wherein the area of the openings in the above described mask which correspond to the attaching portions provided in the peripheral region of the above described insulating film is smaller than the area of the above described attaching portions.

In the present invention, solder is provided in attaching portions in the peripheral region using a mask where the area of the openings which correspond to attaching portions in the peripheral region is smaller than that of the attaching portions in the peripheral region. Accordingly, the area occupied by the solder in particle form that is provided using a squeegee is small compared to the attaching portions in the peripheral region. In addition, the thickness of the solder bumps which are formed throughout the entirety of the attaching portions after the solder in particle form has been melted is little compared to the thickness of solder in particle form when the solder is provided.

According to the first aspect of the present invention, in the case where a plurality of wires are provided on one surface of an insulating film, through holes are provided in the insulating film, the wires are exposed from the, other surface of the insulating film through the through holes and solder is provided to the wires which are exposed through the through holes, the area of the exposed attaching portions of the wires which are provided in the peripheral region of the insulating film is greater than the area of the exposed attaching portions of the wires which are provided in the inward region of the insulating film. As a result, the strength of connection in the peripheral region when a piezoelectric element is connected can be increased. In addition, at the time when a wiring board to which a piezoelectric element has been connected is bent in order to be mounted to an inkjet printer, and after being mounted, the possibility that the connection portion can be broken due to stress caused by bending is reduced. Furthermore, the inkjet head yield can be increased during the manufacturing process and the occurrence of trouble after the delivery of the products can be reduced.

According to the second aspect of the present invention, in the case where a plurality of wires are provided to an insulating film, a terminal land is formed in each wire and solder is provided to the terminal lands, the area of the terminal lands which are provided in the peripheral region of the insulating film is greater than that of the inward region of the insulating film. The strength of connection in the peripheral region when a piezoelectric element is connected can be increased. In addition, at the time when a wiring board to which a piezoelectric element has been connected is bent in order to be mounted to an inkjet printer, and after being mounted, the possibility that the connection portion can be broken due to stress caused by bending is reduced. Furthermore, the inkjet head yield can be increased during the manufacturing process and the occurrence of trouble after the delivery of the products can be reduced.

According to the third aspect of the present invention, the thickness of the solder that is provided in the attaching portions of the peripheral region is approximately the same as that in the inward region of the insulating film. As a result, the state of connection between the solder bumps on the wiring board and the terminals of the piezoelectric element becomes the same both in the peripheral region and in the inward region. Furthermore, even in the case where the area of the attaching portions of the peripheral region is increased, the possibility of a defective connection occurring in the process for connecting a piezoelectric element during the manufacturing process for an inkjet head can be reduced. The strength of connection between the piezoelectric element and the wiring board can be increased without reducing the inkjet head yield during the manufacturing process.

According to the fourth aspect of the present invention, a region which includes a plurality of attaching portions to which solder is to be provided is formed in the inward region of an insulating film and attaching portions having a large area are provided at the four corners in the periphery of the region. As a result, the strength of connection at the four corners in the periphery of the region, where the connection between the insulating film and the piezoelectric element is easily broken, can be increased such that the connection between the insulating film and the piezoelectric element can be efficiently prevented from being broken. In addition, the attaching portions in the peripheral region are elliptically formed, and thereby, the strength of connection is increased against external force in the direction of the long axis of the ellipsis, that is to say, in the direction in which the wires on the insulating film extend. In other words, in the case where the attaching portions are in elliptical form having a long axis in the direction in which external forces are applied due to bending, at the time when a wiring board to which a piezoelectric element has been connected is bent in order to be mounted to an inkjet printer, and after being mounted, the possibility that the connection portion can be broken due to stress caused by bending is reduced.

According to the fifth aspect of the present invention, in the case where solder is provided to the wiring board where the area of the attaching portions of the peripheral region on the insulating film is large, solder in particle form is provided using a mask where the area of the openings which correspond to the attaching portions in the peripheral region is smaller than that of the attaching portions. As a result, the thickness of solder bumps which are formed after the solder in particle form is melted can be made approximately the same between the peripheral region of the insulating film and the inward region. Accordingly, it is difficult for a defective connection to occur in the process for connecting a piezoelectric element during the manufacturing process for an inkjet head and the inkjet head yield during the manufacturing process is not reduced. In addition, the area in the attaching portions of the peripheral region is large, and thereby, the strength of connection between the piezoelectric element and the wiring substrate can be increased without failure. Furthermore, at the time when a wiring board to which a piezoelectric element has been connected is bent in order to be mounted to an inkjet printer, and after being mounted, the possibility that the connection portion can be broken due to stress caused by bending is reduced.

According to the sixth aspect of the present invention, in the case where solder is provided to a wiring board where the area of attaching portions of the peripheral region on the insulating film is large, the openings in the mask which correspond to the attaching portions that are provided in the inward region on the insulating film are in tapered form where the diameter expands toward the side that makes contact with the insulating film. Solder in particle form is provided, using this mask, and thereby, the thickness of the solder bumps which are formed after the solder in particle form has been melted can be made approximately the same both in the peripheral region and in the inward region of the insulating film. Accordingly, it is difficult for a defective connection to occur in the process for connecting a piezoelectric element during the manufacturing process for an inkjet head and the inkjet head yield during the manufacturing process is not reduced. In addition, the area in the attaching portions of the peripheral region is large, and thereby, the strength of connection between the piezoelectric element and the wiring substrate can be increased without failure. Furthermore, at the time when a wiring board to which a piezoelectric element has been connected is bent in order to be mounted to an inkjet printer, and after being mounted, the possibility that the connection portion can be broken due to stress caused by bending is reduced.

According to the seventh aspect of the present invention, in the case where solder in particle form is pressed with a squeegee so as to be provided to a wiring board where the area of attaching portions of the peripheral region on the insulating film is large, the pressing force for providing solder to the attaching portions in the peripheral region is made smaller than the pressing force for providing solder to the attaching portions in the inward region. As a result, the thickness of the solder bumps which are formed after the solder in particle form has been melted can be made approximately the same both in the peripheral region and in the inward region on the insulating film. Accordingly, it is difficult for a defective connection to occur in the process for connecting a piezoelectric element during the manufacturing process for an inkjet head and the inkjet head yield during the manufacturing process is not reduced. In addition, the area in the attaching portions of the peripheral region is large, and thereby, the strength of connection between the piezoelectric element and the wiring substrate can be increased without failure. Furthermore, at the time when a wiring board to which a piezoelectric element has been connected is bent in order to be mounted to an inkjet printer, and after being mounted, the possibility that the connection portion can be broken due to stress caused by bending is reduced.

According to the eighth aspect of the present invention, in the case where solder in particle form is provided to a wiring board where the area of the attaching portions of the peripheral region on the insulating film is large, solder having a large particle size, is selected to be provided to the attaching portions of the peripheral region. As a result, the thickness of the solder bumps which are formed after the solder in particle form has been melted can be made approximately the same both in the peripheral region and in the inward region on the insulating film. Accordingly, it is difficult for a defective connection to occur in the process for connecting a piezoelectric element during the manufacturing process for an inkjet head and the inkjet head yield during the manufacturing process is not reduced. In addition, the area in the attaching portions of the peripheral region is large, and thereby, the strength of connection between the piezoelectric element and the wiring substrate can be increased without failure. Furthermore, at the time when a wiring board to which a piezoelectric element has been connected is bent in order to be mounted to an inkjet printer, and after being mounted, the possibility that the connection portion can be broken due to stress caused by bending is reduced.

According to the ninth aspect of the present invention, solder in particle form is provided using a mask where the area of the openings which correspond to the attaching portions of the peripheral region is smaller than that of the attaching portions, and thereby, it becomes easy for the thickness of the solder bumps that are formed after the solder in particle form has been melted to be made approximately the same both in the peripheral region and in the inward region on the insulating film. Accordingly, it is difficult for a defective connection to occur in the process for connecting a piezoelectric element during the manufacturing process for an inkjet head and the inkjet head yield during the manufacturing process is not reduced. In addition, the area in the attaching portions of the peripheral region is large, and thereby, the strength of connection between the piezoelectric element and the wiring substrate can be increased without failure.

The above and further objects and the features of the invention will more fully be apparent from the following detailed description with accompanying drawings.

BRIEF DESCRIPTION OF THE SEVERAL VIEWS OF THE DRAWINGS

FIGS. 3A and 3B are plan diagrams showing the configuration of a wiring board according to the present invention;

FIGS. 7A and 7B are schematic plan diagrams showing the relationship in the form between the attaching portions on a flexible wiring board and the openings of the mask according to the present invention;

FIGS. 11A to 11J are schematic diagrams illustrating a manufacturing process for forming solder bumps of the flexible wiring board according to Modification 2 of the present invention.

DETAILED DESRIPTION

In the following, the present invention is concretely described in reference to the drawings showing the embodiments thereof.

Figure 1:
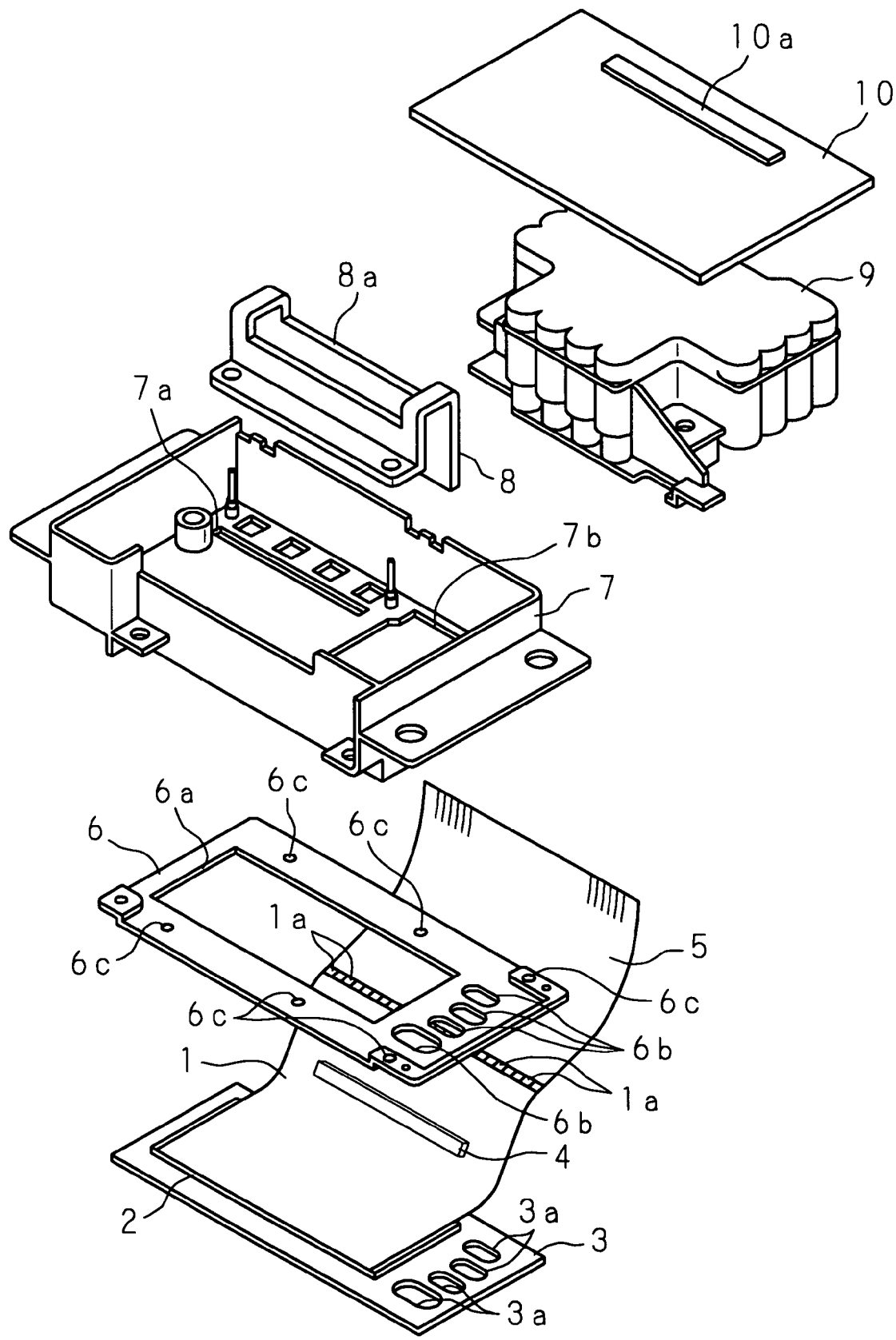
FIG. 1 is an exploded perspective diagram showing the configuration of an inkjet head according to the present invention.
Figure 2:
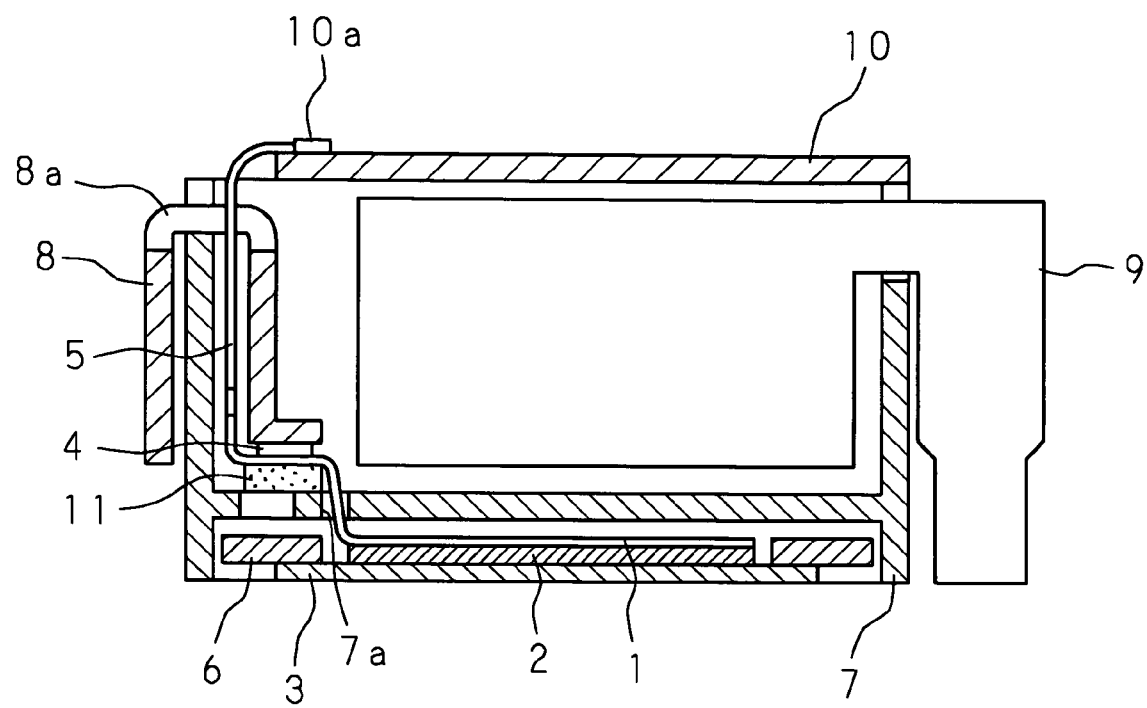
FIG. 2 is a cross sectional side diagram showing the configuration of an inkjet head according to the present invention.

As shown in FIGS. 1 and 2, an inkjet head has a flow path unit 3 for discharging ink which is placed so as to face a recording medium. The flow path unit 3 is a layered body where a plurality of metal plates, to which through holes in different forms are created respectively, are layered on a nozzle plate, where a plurality of discharging openings for ink are created, made of resin and having an outer form that is approximately rectangular. Through holes in the metal plates are connected above and below, and thereby, spaces which form ink flow paths, ink pressure chambers, and the like are created within the flow path unit 3. The ink flow paths are provided for inks of respective colors of cyan, magenta, yellow and black, and in addition, the ink pressure chambers are provided for the respective discharging openings on the upper side the flow path unit 3. Four ink supplying openings 3a, 3a . . . for supplying ink to each ink flow path on one end side in the longitudinal direction are aligned along a short side of flow path unit 3 on the upper surface of the flow path unit 3. As a result, in the case where ink is supplied from an ink supplying openings 3a, 3a . . . , ink is distributed to an ink pressure chamber through an ink flow path so as to be discharged from an ink discharging opening on the lower surface of the flow path unit 3.

A piezoelectric element 2 for applying pressure to discharge ink within each ink pressure chamber is attached with an adhesive to the upper surface of the flow path unit 3. The piezoelectric element 2 is approximately in rectangular plate form, which is smaller than the flow path unit 3, and is attached to the flow path unit 3 along its longitudinal direction, closer to the short side where ink supplying openings 3a, 3a . . . are not provided. The piezoelectric element 2 is also a layered body where a plurality of, for example, $PbTiO_3$—$PbZrO_3$ based ceramic plates, are layered. A plurality of individual terminals which correspond to the respective ink pressure chambers are aligned along a plurality of lines on the upper side of the piezoelectric element 2. In addition, a plurality of common terminals which are connected to the grounding potential are provided so as to surround the individual terminals. As a result, a drive voltage for applying pressure to discharge ink by changing the form of piezoelectric element 2 is applied via individual terminals.

A flexible wiring board 1 in film form having a plurality of wires is connected to the upper surface of the piezoelectric element 2 via soldering. That is to say, individual terminals and common terminals of the piezoelectric element 2 and the terminal lands, which are provided on the flexible wiring board 1, are connected via soldering. The outer form of the flexible wiring board 1 is approximately rectangular, and the length of the short sides is slightly shorter than the length of the long sides of the piezoelectric element 2. As shown in FIG. 1, the piezoelectric element 2 is connected to the flexible wiring board 1 on the side of one short side. A plurality of connection terminals 1a, 1a . . . , for connecting a flat cable 5 for relaying wires, are provided in an edge portion along the opposite short side of the flexible wiring board 1. In addition, a drive IC 4, for generating a drive voltage to drive the piezoelectric element 2, is soldered to the surface on the side opposite to the surface of the flexible wiring board 1, to which the piezoelectric element 2 is connected in a location between the piezoelectric element 2 and the connection terminals 1a, 1a . . . .

The drive IC 4 is provided with a plurality of drive circuits on its inside, corresponding to the the ink discharging openings that are provided to the flow path unit 3. As a result, a drive voltage of approximately 15 V to 30 V is supplied from each driving circuit to each of the individual terminals of the piezoelectric element 2 via a wire that is formed on the flexible wiring board 1.

The flat cable 5 is in film-form, which is approximately rectangular, and one end is connected to the connection terminals 1a, 1a . . . of the flexible wiring board 1, and the other end is connected to a connector, 10a of a circuit substrate 10 on which a control circuit for the inkjet printer is mounted. The flat cable 5 is provided with a plurality of wires with the two ends connected on its inside, and relays a plurality; of control signals for operating the drive IC 4 and the power for the operation of logic circuits and for the driving voltage, which are supplied from a circuit board 10. That is to say, the control signals, the power and the like are supplied to the drive IC 4 that is mounted on the flexible wiring board 1 via the flat cable 5. As a result, the piezoelectric element 2, to which the drive voltage is supplied, displaces, and thus, applies pressure to the ink inside of the corresponding ink pressure chamber such that the ink is delivered.

Furthermore, a reinforcement frame 6, in approximately rectangular plate form that is greater than the flow path unit 3 where an approximately rectangular opening 6a that is greater than the piezoelectric element 2 is formed, is attached along with the piezoelectric element 2 with an adhesive to the upper surface of the flow path unit 3. The reinforcement frame 6 surrounds the piezoelectric element 2 and reinforces the flow path unit 3. In addition, four through holes 6b, 6b . . . are formed in locations on the reinforcement frame 6, which correspond to the ink supplying openings 3a, 3a . . . of the flow path unit 3, and furthermore, a plurality of holes for screws 6c, 6c . . . are aligned along the two long sides of the reinforcement frame 6. Here, the piezoelectric element 2 and the flexible wiring board 1 are exposed from the upper side of the reinforcement frame 6 through the openings 6a of the reinforcement frame 6.

The above described flow path unit 3, the piezoelectric element 2, the flexible wiring board 1 and the reinforcement frame 6 are connected to each other with an adhesive or by soldering such that an integrated layered body is formed. This layered body is screwed to the lower surface of a holder 7, made of resin using holes for screws 6c, 6c . . . , in the reinforcement frame 6. Furthermore, the holder 7 is approximately a rectangular parallelepiped with an open upper surface, and an ink buffer tank 9 is contained inside. A slit 7a is formed in the lower surface of the holder 7. As shown in FIG. 2, the flexible wiring board 1 and the flat cable 5 are lead out from the bottom (lower surface side) of the holder 7 through the slit 7a. That is to say, the flexible wiring board 1 and the flat cable 5 are once bent upwards so as to be approximately vertical between the piezoelectric element 2 and the drive IC 4 in order to be lead out from the slit 7a, and furthermore, are bent again approximately vertically in a portion behind the location where the drive IC 4 is installed so as to be lead out upwardly. As shown in FIG. 2, in the present embodiment, the piezoelectric element 2 and the drive IC 4 are placed below and above the bottom of the holder 7 so as to be parallel to each other. Therefore, the flexible wiring board 1 is bent upwardly so as to be approximately vertical between the piezoelectric element 2 and the slit 7a (at the location of the first bending), is bent so as to be approximately horizontal between the slit 7a and the drive IC 4 (at the location of the second bending), and is bent upwardly so as to be approximately vertical before extending along a side wall of the holder 7, starting from the drive IC 4 (at the location of the third bending).

In addition, a heat sink 8, for releasing heat from the drive IC 4, is provided so as to crossover one side wall of the holder 7. The heat sink 8 is a rectangular metal plate that is curved in approximately an inverted U shape, and is bent outwards approximately in a right angle at one end. This bent portion is placed inside the holder 7 so as to make contact with the drive IC 4. The width of the heat sink 8 in the direction along a side wall of the holder 7 is greater than the length of the short sides of the flexible wiring board 1 and the flat cable 5, and a notch 8a having a width that is approximately the same as the length of the short sides of the flexible wiring board 1 and the flat cable 5 is made in the upper portion of the heat sink 8.

A cushioning material 11 made of rubber (shown only in FIG. 2) in approximately rectangular parallelepiped form, of which the length is approximately the same as the length of the short sides of the flexible wiring board 1, is provided at the bottom of the holder 7 so as to face the lower surface of the bent portion of the heat sink 8. The flexible wiring board 1 and the drive IC 4 are sandwiched between the bent portion of the heat sink 8 and the cushioning material 11. As a result of this, the heat that is generated during the operation of the drive IC 4 is released to the outside of the holder 7 via the heat sink 8.

Furthermore; the flexible wiring board 1 is bent upwardly so as to be approximately vertical between the drive IC 4 and the connection terminals 1a, 1a . . . (at the location of the third bending) such that the flat cable 5, which is connected to the connection terminals 1a, 1a . . . , passes through a space between the side wall of the holder 7 and the heat sink 8 so as to be lead to the upper side of the holder through the notch 8a.

The ink of each color, cyan, magenta, yellow or black, is supplied to an ink buffer tank 9, which is contained within the holder 7, from four ink cartridges that respectively contain the above described ink via ink supplying tubes, not shown. The supplied ink is temporarily stored in the ink buffer tank 9, and then, supplied to the flow path unit 3. One approximately rectangular through hole 7b having a size that includes four through holes 6b, 6b . . . of the reinforcement frame 6 is formed at the bottom of the holder 7 so as to correspond to the locations of the ink supplying openings 3a, 3a . . . of the flow path unit 3 and the through holes 6b, 6b . . . The ink buffer tank 9, in the space above the bottom, and the reinforcement frame, in the space below the bottom, are joined via the through hole. 7b. As a result, the ink within the ink buffer tank 9 can be supplied to the flow path unit 3 via the through holes 6b, 6b . . . of the reinforcement frame 6 as well as the ink supplying openings 3a, 3a . . . of the flow path unit 3.

The circuit board 10 is placed so as to cover the upper surface of the ink buffer tank 9 above the holder 7, which contains the ink buffer tank 9. In the present embodiment, the circuit board 10 forms a lid for the holder 7. The flat cable 5, which is lead above the holder 7 through the notch 8*a* of the heat sink 8, is connected to the connector 10*a* that is provided on the upper surface of the circuit board 10. As a result, the circuit board 10 and the flexible wiring board 1 are electrically connected.

Figure 4:
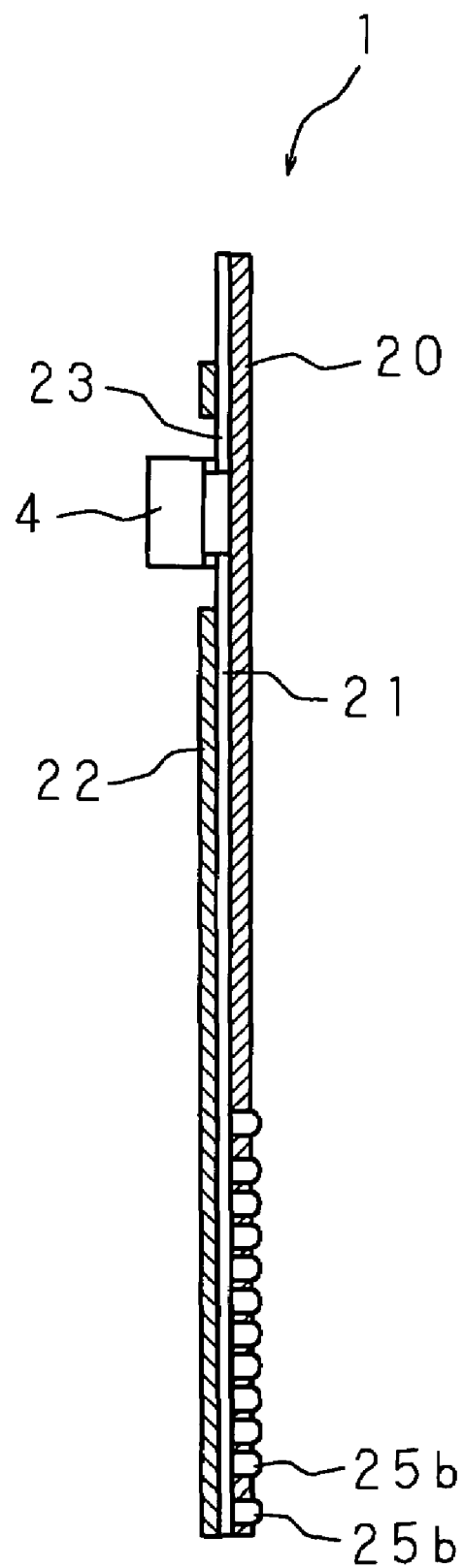
FIG. 4 is a schematic cross sectional side diagram showing the configuration of a wiring board according to the present invention.

In reference to FIG. 3A, showing the upper surface (surface to which the drive IC 4 is connected) of the wiring board, in reference to FIG. 3B, showing the lower surface, and in reference to FIG. 4, there is a detailed description in the following.

The flexible wiring board 1 is a flexible board made of a synthetic resin such as a polyimide resin, a polyester resin or the like, and is mainly formed of an approximately rectangular insulating film 20 and a plurality of wires 21 provided on the upper surface of the insulating film 20. The wires 21 are formed of a metal such as copper and aluminum, and furthermore, are covered with an insulating film 22 made of synthetic resin. The wires 21 include wires for drive voltage (wires for driving) 21*a*, 21*a* . . . , which convey the drive voltage from the drive IC 4, a wire for the grounding potential (wire for grounding) 21*b*, which supplies the grounding potential via connection terminals 1*a*, 1*a* . . . that are connected to the flat cable 5, and signal wires 21*c*, 21*c* . . . for conveying a signal from the connection terminals 1*a*, 1*a* . . . to the drive IC 4. In addition, the drive IC 4 is soldered to the wires for driving 21*a*, 21*a* . . . and the signal wires 21*c*, 21*c* . . . that are exposed in the IC connection portion 23, which is the portion that is not covered with the insulating film 22 on the upper surface of the insulating film 20. Here, signal wires 21*c*, 21*c* . . . extend in the longitudinal direction of the insulating film 20 from the respective connection terminals 1*a*, 1*a* . . . to the IC connection portion 23.

The wires for driving 21*a*, 21*a* . . . are microscopic wires of which the line width is approximately 20 μm and extend in the longitudinal direction of the insulating film 20 from the IC connection portion 23 to the side opposite the connection terminals 1*a*, 1*a* . . . . In addition, as shown in FIGS. 3A and 3B, several hundreds of the wires for driving 21*a*, 21*a* . . . are aligned at equal intervals, and these intervals are approximately 20 μm. One end of each of the wires for driving 21*a*, 21*a* . . . is connected to a connection terminal of the drive IC 4, and the other end forms each of a plurality of terminal lands 24, 24 . . . for forming solder bumps 25*a*, 25*a* . . . to which solder is provided.

Each of the terminal lands 24, 24. . . has an approximately circular form of which the diameter is approximately 150 μm. As shown in FIGS. 3A and 3B, twenty-eight terminal lands 24, 24 . . . are aligned in a line in the direction of the short sides of the insulating film 20, and furthermore, ten lines of terminal lands 24, 24 . . . are aligned in the direction of the long sides of the insulating film 20 in such a manner that the terminal lands 24, 24. . . are staggered in the arrangement. The entirety of a wire terminal region 30 where terminal lands 24, 24 . . . are formed (shown by a broken line in FIGS. 3A and 3B) is rectangular in plan view, and has approximately the same size and form as those of the region of the piezoelectric element 2 where the individual terminals are provided.

The wires for grounding 21*b* are wires of which the line width is as large as approximately several mm to several tens of mm, and have a width to such an extent that no lack in the supply of power occurs even when the drive voltage is simultaneously applied to a plurality of individual terminals. In addition, the wire for grounding 21*b* is provided along the periphery of the insulating film 20, excluding the short side portion (one end portion) where the connection terminals 1*a*, 1*a* . . . are aligned. Therefore, the two ends of the wire for grounding 21*b* are respectively connected to the connection terminals 1*a* and 1*a* on both ends of the insulating film 20 in the direction of the short sides in one end portion of the insulating film 20. As described above, the respective signal wires 21*c*, 21*c* . . . , the drive IC 4, the respective wires for driving 21*a*, 21*a* . . . and the wire terminal region 30, which includes the terminal lands 24, 24 . . . , are sequentially provided from one end to the other end of the insulating film 20 in the inward region that is surrounded by the wire for grounding 21*b* on the flexible wiring board 1.

A plurality of solder bumps 25*a*, 25*a* . . . which are approximately circular in plan view are provided in a plurality of lines on the lower surface of the insulating film 20 so as to correspond to the locations of the terminal lands 24, 24 . . . which are provided on the upper surface. In addition, a plurality of solder bumps 25*b*, 25*b* . . . which are approximately elliptical having a long axis in the longitudinal direction of the insulating film 20 in a plan view are provided so as to surround the solder bumps 25*a*, 25*a* . . . on the lower surface of the insulating film to correspond to the portion on the upper surface where the wire for grounding 21*b* is provided.

A bump provided region 31 (shown by a dashed line in FIGS. 3A and 3B) which includes solder bumps 25*a*, 25*a* . . . is formed on the lower surface side of the insulating film 20 so as to correspond to the wire terminal region 30 on the upper surface side. The wire terminal region 30 and the bump provided region 31 have approximately the same size and similar forms.

In FIG. 3B, the solder bumps 25*b*, 25*b* . . . consists of:
(i) ten solder bumps 25*b*, 25*b* . . . which are aligned adjacent to each of the two short sides, totaling twenty, of the bump provided region 31 that includes the solder bumps 25*a*, 25*a* . . . , that is to say aligned along the ends on the long sides of the insulating film 20;
(ii) two solder bumps 25*b* and 25*b* which are provided at both ends of each of the two solder bumps 25*b*, 25*b* . . . , totaling four, the ten solder bumps 25*b*, 25*b* . . . forming each of the lines;
(iii) three solder bumps 25*b*, 25*b* . . . which are aligned at the ends of a short side along the short side of the insulating film, totaling six.

That is to say, elliptical solder bumps 25*b*, 25*b* . . . , totaling thirty, are provided on the lower surface of the insulating film 20.

The approximately elliptical solder bumps 25*b*, 25*b* . . . are formed outside and along the three sides of the bump provided region 31, while the solder bumps 25*b*, 25*b* . . . are provided at locations which surround the bump provided region 31 from the outside.

In addition, some pairs of solder bumps 25*b*, 25*b* . . . are adjacent to the four corners of the bump provided region 31. Furthermore, the other pairs of solder bumps 25*b*, 25*b* . . . form two lines and these two lines are provided parallel to each other in the direction in which the flexible wiring board 1 is drawn out, that is to say, in the longitudinal direction in which wires for driving 21*a*, 21*a* . . . extend.

Some pairs of solder bumps 25*b*, 25*b* . . . are located so as to be adjacent to the two short sides of the bump provided region 31, and the other pairs of solder bumps 25*b*, 25*b* . . . are adjacent to the four corners the bump provided region 31.

A plurality of solder bumps 35*b*, 35*b* . . . from among the above described solder bumps 25*b*, 25*b* . . . are provided in linear form along the short side of the insulating film 20 on the other end (end on the side opposite the connection terminals 1*a*, 1*a* . . . ) of the flexible wiring board 1.

Figure 5A:
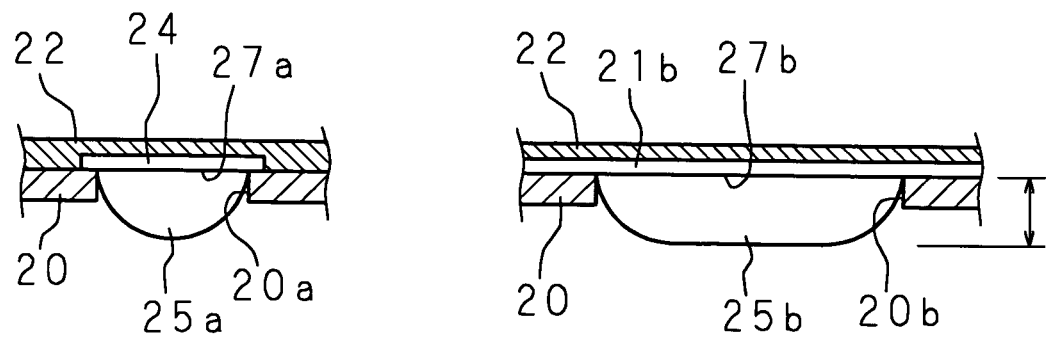
FIGS. 5A and 5B are schematic diagrams showing the configuration of solder bumps of a flexible wiring board according to the present invention.
Figure 5B:
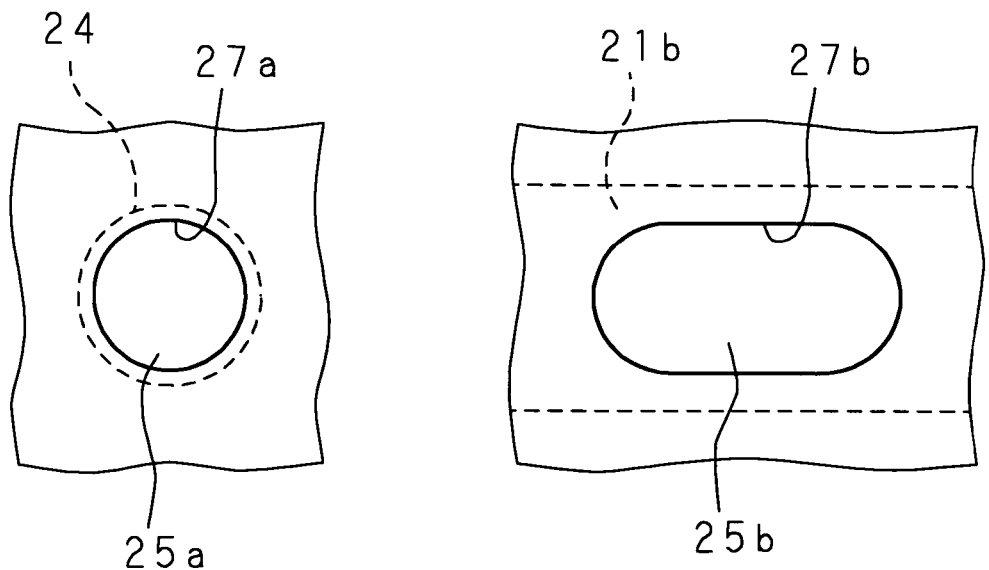

FIGS. 5A and 5B illustrate a circular solder bump 25*a* and an elliptical solder bump 25*b*. In addition, FIG. 5A is a cross sectional side diagram showing the solder bumps 25*a* and 25*b* while FIG. 5B is a plan diagram showing the respective solder bumps so as to correspond to the above figure.

An approximately circular through hole 20a which is smaller than a terminal land 24 is created in insulating film 20 so as to correspond to the location of the terminal land 24 in such a manner that the terminal land 24 and the through hole 20a are in a concentric form and a portion of the terminal land 24 is exposed from the lower surface of the insulating film 20 through the through hole 20a. The exposed portion of this terminal land 24 is a attaching portion 27a to which solder is provided. This attaching portion 27a is provided in the inward region of the insulating film. Solder is provided on the attaching portion 27a that is approximately circular and an approximately hemispherical solder bump 25a is formed. As shown in FIG. 3B, a plurality of solder bumps 25a, 25a . . . is provided on the other end (end on the side opposite the connection terminals 1a, 1a . . . ) of the flexible wiring board 1, and thus, a bump provided region 31, of which the entirety is rectangular, is formed. Accordingly, the bump provided region 31 that is shown by a dashed line in FIGS. 3A and 3B is also a region where the portions to which solder is provided are provided.

In addition, a plurality of approximately elliptical through holes 20b are created in the insulating film 20 so as to correspond to the wires for grounding 21b which surround the bump provided region 31 from the three sides. In the present embodiment, all of the through holes 20b have approximately the same width as the diameter of the through holes 20a. In the same manner as a terminal land 24, a portion of a wire for grounding 21b is also exposed from the lower surface of the insulating film 20. This exposed portion is a attaching portion 27b to which solder is provided. This attaching portion 27b is provided in the peripheral region of the insulating film. Solder is provided to the portion 27b, and a solder bump 25b is formed. That is to say, the area of the portion 27b which is approximately elliptical is greater than the area of the attaching portion 27a that is approximately circular, and therefore, the solder bump 25b is greater than the solder bump 25a. In addition, the solder bump 25b and the solder bump 25a have approximately the same thickness. As shown in FIG. 3B, solder bumps 25b are provided so as to be adjacent to the four corners of the bump provided region 31 that is formed of solder bumps 25a, and surround the bump provided region 31 from the outside.

Figure 6:
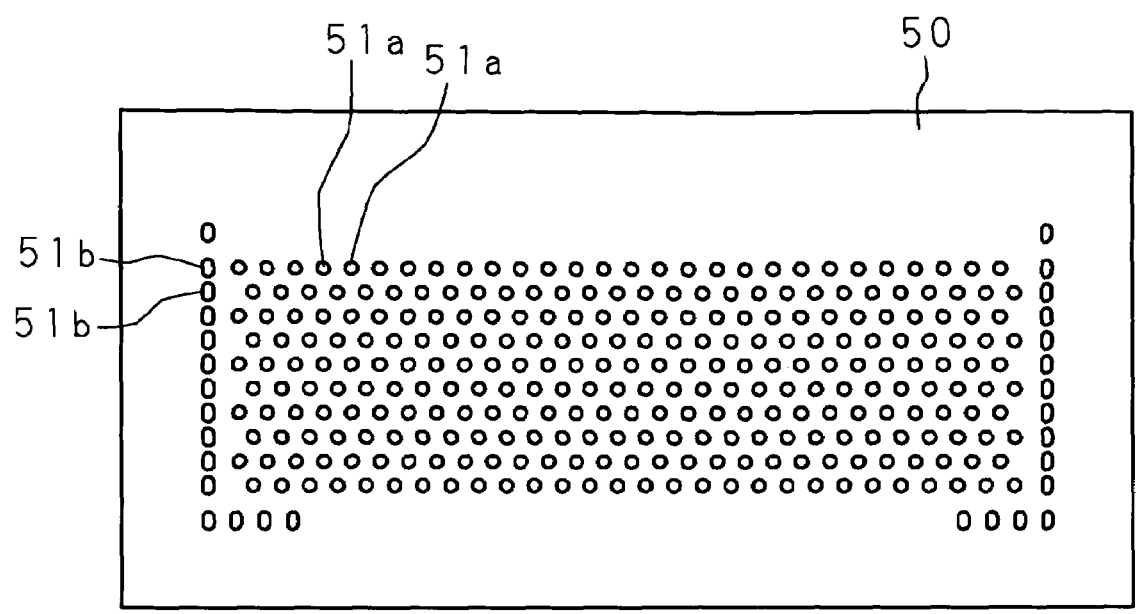
FIG. 6 is a plan diagram showing a mask, which is used when solder bumps of a flexible wiring board according to the present invention are formed.

As shown in FIG. 6, a mask 50 is gained by forming a plurality of openings in a thin metal plate. In the present embodiment, the thickness of the metal plate is approximately 80 μm. In the mask 50, approximately circular openings 51a, 51a . . . are provided at locations in the mask 50 which correspond to the approximately circular attaching portions 27a, 27a . . . which are provided in the flexible wiring board 1, and approximately elliptical openings 51b, 51b . . . are provided at locations which correspond to the approximately elliptical attaching portions 27b, 27b. . . .

FIG. 7A shows an approximately circular attaching portion 27a and an approximately elliptical attaching portions 27b to which solder is provided. FIG. 7B shows openings 51a and 51b which correspond to the respective portions to which solder is provided.

The opening 51a for providing solder to the approximately circular attaching portion 27a is approximately circular of which the diameter is slightly greater than that of the attaching portion 27a. The opening 51b for providing solder to the approximately elliptical attaching portion 27b is slightly shorter in the length and is slightly greater in the width of the attaching portion 27b. In addition, the area of the opening 51b is smaller than the area of the attaching portion 27b. Table 1 shows an example of the dimensions of the attaching portions 27a and 27b, the dimensions of the openings 51a and 51b as well as the dimensions of the thickness of the formed solder bumps.

TABLE 1

|  | circle diameter (micrometers) | elliptical (micrometers × micrometers) |
| --- | --- | --- |
| attaching portions | 150 | 400 × 170 |
| mask openings | 200 | 330 × 200 |
| thickness of solder bumps (micrometers) | 65 | |

Figure 8A:
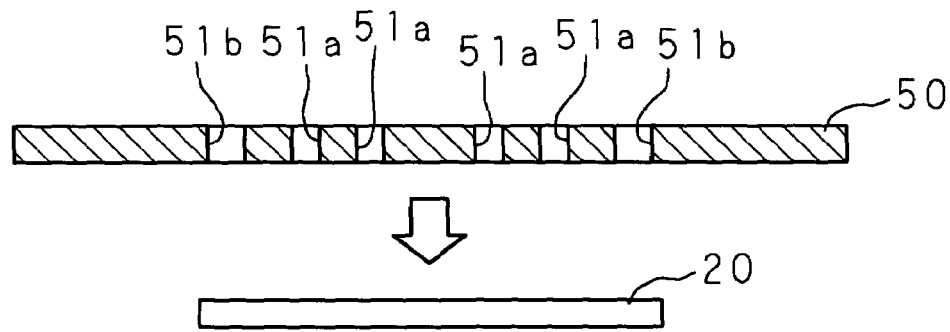
FIGS. 8A to 8E are schematic diagrams illustrating a manufacturing process for forming solder bumps of a flexible wiring board according to the present invention.
Figure 8B:
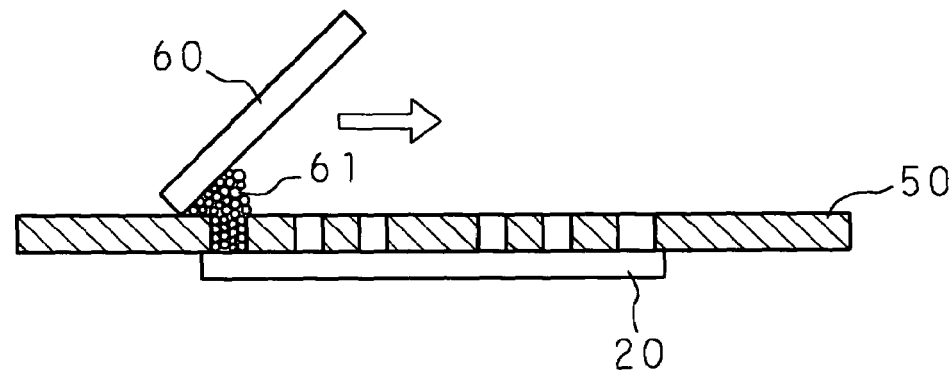
Figure 8C:
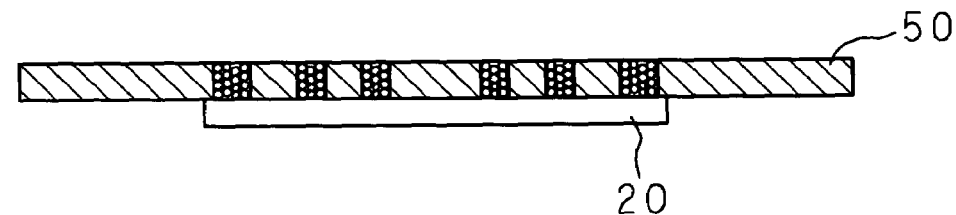

As shown in FIGS. 8A to 8E, at the time of the formation of solder bumps 25a, 25a . . . and solder bumps 25b, 25b . . . , first, a mask 50 is made to make contact with the surface of the insulating film 20 from which the attaching portions 27a, 27a . . . and the attaching portions 27b, 27b . . . are exposed (see FIG. 8A). At this time, the attaching portions 27a, 27a . . . and the attaching portions 27b, 27b . . . are positioned to the corresponding openings 51a, 51a . . . and openings 51b, 51b . . . , respectively. After that, cream solder 61 which includes solder in particle form is applied to one side of the mask 50, and a squeegee 60 is shifted from one side of the mask 50 to the other side while pressing the mask 50 with a constant pressure (see FIG. 8B). Thus, the openings 51a, 51a . . . and openings 51b, 51b . . . are filled in with the cream solder 61 while wiping off the cream solder 61 using the squeegee 60. FIG. 8C shows the state after filling.

Figure 8D:
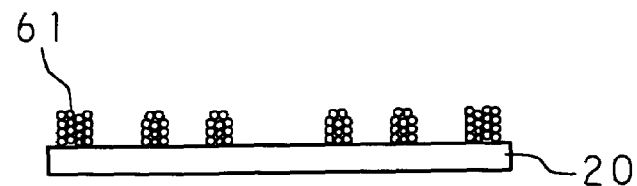
Figure 8E:
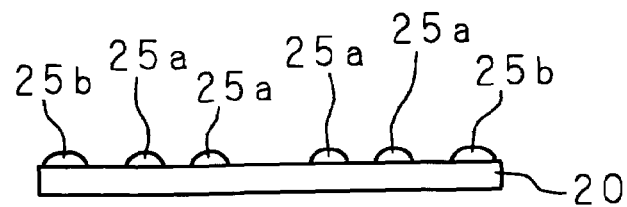

After that, the mask 50 making contact with the insulating film 20 is removed. The cream solder 61 with which the openings 51a, 51a . . . and openings 51b, 51b . . . in the mask 50 are filled in disengages from the openings 51a, 51a . . . and openings 51b, 51b . . . so as to stay on the attaching portions 27a, 27a . . . and attaching portions 27b, 27b . . . . FIG. 8D shows the state where the mask 50 has been removed. Next, the insulating film 20 to which the cream solder 61 has been provided is heated in a reflow furnace. Thus, the cream solder is melted and solder bumps 25a, 25a . . . and solder bumps 25b, 25b . . . are formed. FIG. 8E shows the state after being heated in the reflow furnace.

The areas of the attaching portions 27a, 27a . . . and the attaching portions 27b, 27b . . . as well as the areas of the openings 51a, 51a . . . and the openings 51b, 51b . . . of the mask 50 are adjusted as shown in Table 1 such that the thickness of the solder bumps 25a, 25a . . . which are approximately circular in a plan view and the thickness of the solder bumps 25b, 25b . . . which are approximately elliptical in a plan view become approximately the same in the state of FIG. 8E. This adjustment is necessary because the greater the area of the openings of the mask 50, the easier the cream solder 61 tends to disengage. In other words, in the case where the above described manufacturing processes carried out for the oceans and the openings having the same area, the solder bumps 25b, 25b . . . become thicker on the attaching portions 27b, 27b . . . having a large area while the solder bumps 25a, 25a . . . become thinner on the attaching portions 27a, 27a . . . having a small area. Accordingly, the area of the openings 51b, 51b . . . which correspond to the attaching portions 27b, 27b . . . having a large area is reduced and the area of the openings 51a, 51a . . . which correspond to the attaching portions 27a, 27a . . . having a small area is increased. As a result, the thickness of the formed solder bumps is adjusted to be uniform.

In the flexible wiring board 1 having the above described configuration, the area of the solder bumps 25b, 25b... in the periphery (peripheral region) of the insulating film 20 is increased in a plan view, and thereby, the strength of the connection in the periphery when a piezoelectric element 2 is connected to the flexible wiring board 1 can be increased. Accordingly, at the time when the flexible wiring board 1 is bent so as to be mounted on an inkjet printer as well as after the time of mounting, the possibility of the connection portion being broken due to stress caused by the bending can be reduced. In addition, the manufacturing process is adjusted such that the thickness of the solder bumps 25a, 25a... and 25b, 25b... becomes approximately the same, and therefore, the possibility of a defective connection occurring due to unevenness in the state of connection when the flexible wiring board 1 and a piezoelectric element 2 are connected can be lowered.

Here, though in the present embodiment the attaching portions 27a are approximately circular and the attaching portions 27b are approximately elliptical, the invention is not limited to this, and the two types of portions may both be approximately circular or approximately elliptical. In addition, the attaching portions 27a and 27b may be respectively in other forms such as a square, rectangle, triangle or diamond. In addition, the arrangement and the the solder bumps 25a and 25b provided on the flexible wiring board 1 are examples and the invention is not limited to this. The configuration where the through hole 20a and 20b are formed in the insulating film 20 and the solder bumps 25a and 25b are formed on the lower surface of the insulating film 20, is shown. However, the configuration is not limited to this, and another configuration may be provided where solder bumps are formed on terminal lands 24 and portions of wires 21c for the grounding potential that are exposed from the upper surface of the insulating film 20 without forming an insulating film 22 over the terminal lands 24 and the attaching portions of wires 21c in the case where an insulating film 22 is formed on the upper surface of the insulating film 20.

In addition, though the mask 50 which is used in the process for forming solder bumps 25a and 25b is made of a metal, the invention is not limited to this, and a mask made of silicone or a compound that includes silicone may be used. In addition, the sizes of the attaching portions 27a and 27b, as well as the sizes of the openings 51a and 51b shown in Table 1 are examples and the invention is not limited to this: In addition, though a method for adjusting the areas of the openings 51a and 51b on the mask 50 is used in order to make the thickness of the solder bumps 25a and 25b approximately the same, the method is not limited to this and the thickness of the solder bumps 25a and 25b may be made approximately the same in accordance with any of the methods shown below.

(Modification 1)

Figure 9:
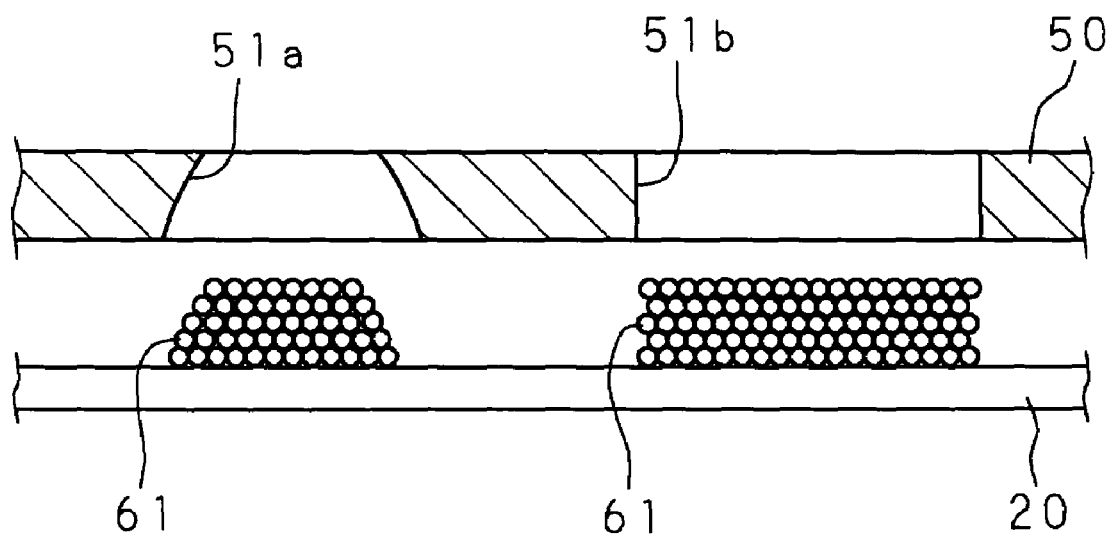
FIG. 9 is a schematic diagram showing the configuration of the mask that is used in the manufacturing process for a flexible wiring board according to Modification 1 of the present invention.

As shown in FIG. 9, in a mask 50 that is used in modification 1, an opening 51a which corresponds to an approximately circular attaching portion 27a having a small area is formed so as to have a tapered form where the diameter expands toward one surface of the mask 50. In addition, an opening 51b which corresponds to an approximately elliptical attaching portion 27b having a large area is an opening having a constant diameter. When the mask 50 is made to make contact with the insulating film 20, the side where the diameter of the opening 51a is greater makes contact with the insulating film 20. As a result, the properties of the opening 51a disengaging from cream solder 61 can be improved, and thus, the thickness of the solder bump 25a that is formed on the attaching portion 27a can be increased. Accordingly, the thickness of the solder bump 25a that is-formed on the attaching portion 27a can be adjusted so as to be approximately the same as the thickness of the solder bump 25b that is formed on the attaching portion 27b.

Here, in the mask 50 that is used in Modification 1, the opening 51b may be formed to have a tapered form in the same manner. In this case, the opening 51b is formed so as to have a tapered form in such a manner that the inclination angle of the taper of the opening 51a is greater than the inclination angle of the taper of the opening 51b.

(Modification 2)

Figure 10A:
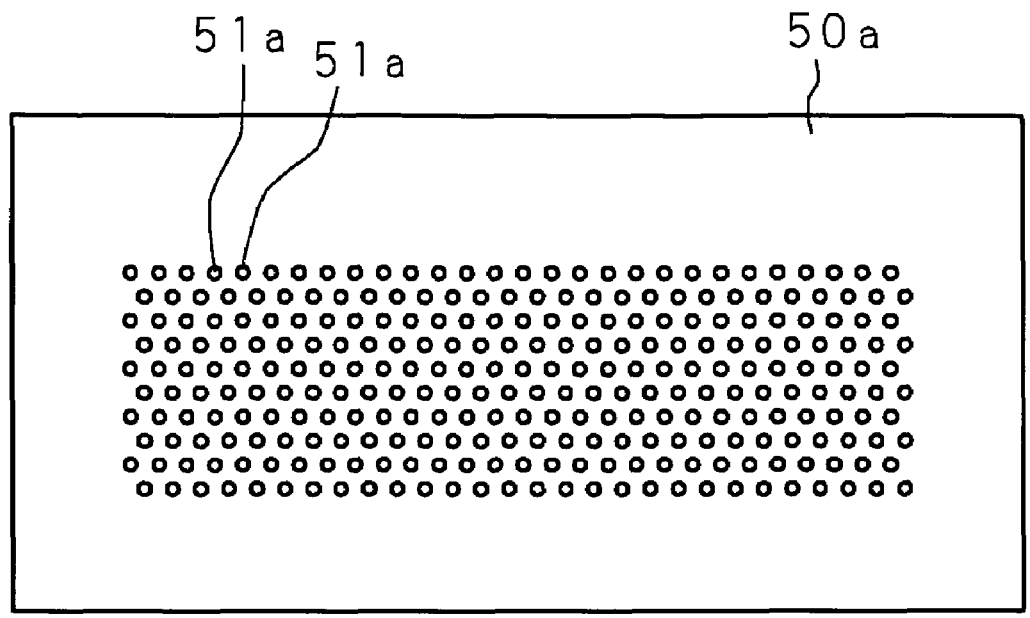
FIGS. 10A and 10B are plan diagrams showing the mask that is used in a manufacturing process for a flexible wiring board according to Modification 2 of the present invention.
Figure 10B:
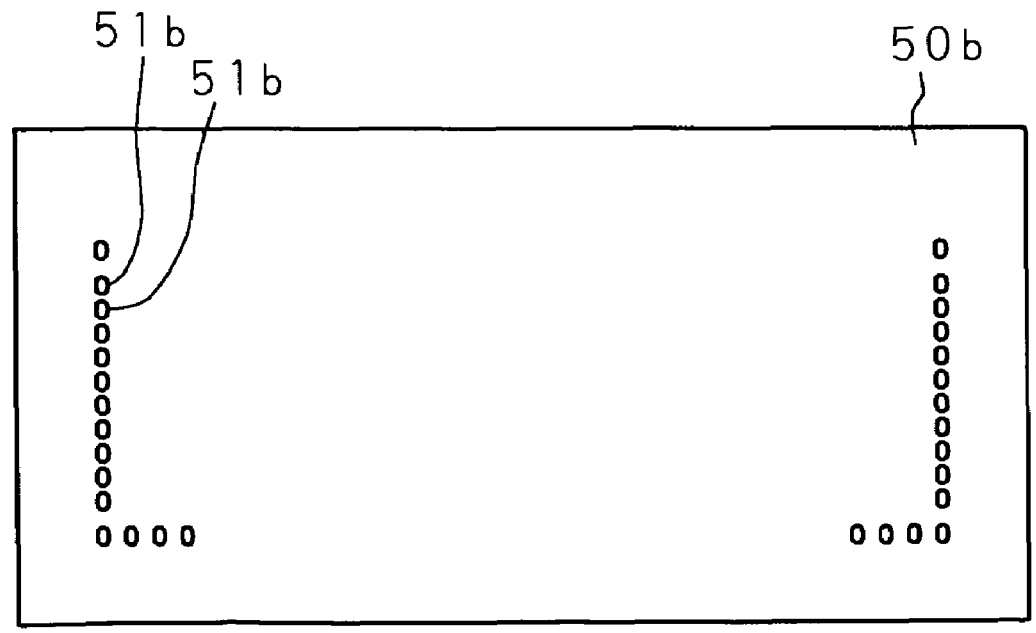

FIG. 10A shows a mask 50a which is used when solder bumps 25a, 25a... are formed on approximately circular attaching portions 27a, 27a... to wish solder is provided. FIG. 10B shows a mask 50b which is used when solder bumps 25b, 25b... are formed on approximately elliptical attaching portions 27b, 27b... which are provided in the periphery of an insulating film 20. Only openings 51a, 51a... which correspond to the attaching portions 27a, 27a... are formed in the mask 50a and only openings 51b, 51b... which correspond to the attaching portions 27b, 27b... are formed in the mask 50b. In addition, the mask 50a and the mask 50b have the same outer sides. The mask 50a and the mask 50b are formed in such a manner that in the case where they are overlapped, the relationship of the relative locations between the openings 51a, 5la... and the openings 51b, 51b... corresponds to the relationship of the locations of the openings of the mask 50. This relationship of the locations is the same as the relationship of the locations of the solder bumps 25a and the solder bumps 25b on the flexible wiring board 1 in a plan view.

Figure 11A:
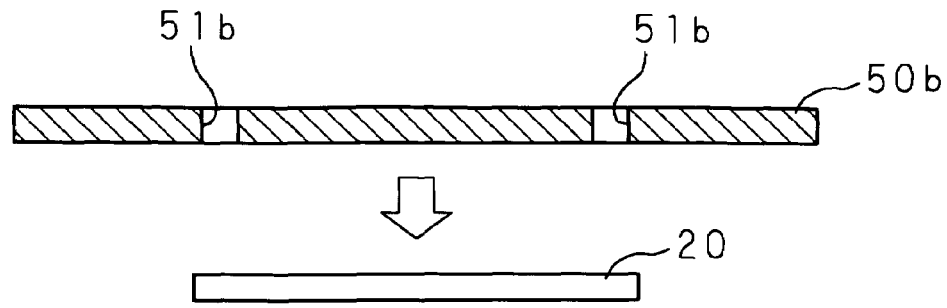
Figure 11B:
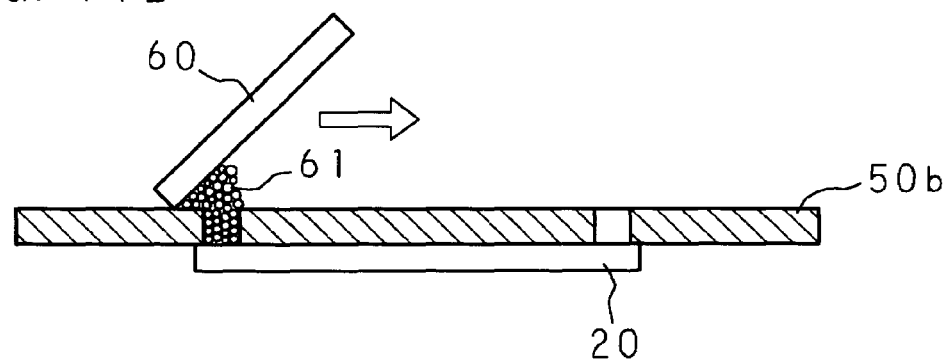
Figure 11C:
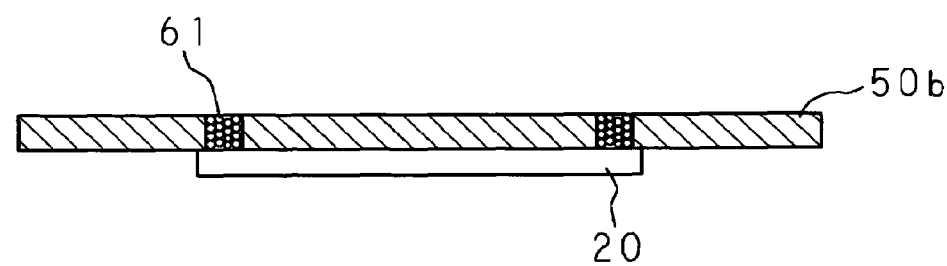

As shown in FIGS. 11A to 11J, first, a mask 50b is made to make contact with the surface of an insulating film 20 from which attaching portions 27a, 27a... and attaching portions 27b, 27b... are exposed (see FIG. 11A). After that, cream solder 61 that includes solder in paste form is applied to one side of the mask 50b, and the mask 50b is shifted from one side of the mask 50b to the other using a squeegee 60 while pressing the mask 50b with constant pressure (see FIG. 11F). Thus, the cream solder 61 is wiped off using the squeegee 60 while the openings of 51b, 51b... in the mask 50b are filled in with the cream solder 61. FIG. 11C shows the state after filling.

Figure 11D:
Figure 11E:
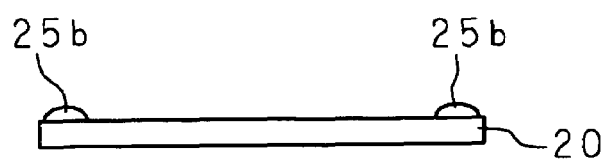

After that, the mask 50b making contact with the insulating film 20 is removed. The cream solder 61 with which the openings 51b, 51b... of the mask 50b are filled in disengages from the openings 51b, 51b... so as to stay on the attaching portions 27b, 27b... of the insulating film 20. FIG. 11D shows the state where the mask 50 has been removed. Next, the insulating film 20 is heated in a reflow furnace such that the provided cream solder 61 is melted and solder bumps 25b are formed. FIG. 11E shows the state after heating in the reflow furnace. As a result, the cream solder 61 is melted and secured to the attaching portions 27b, 27b... as solder bumps 25b, and therefore, the cream solder 61 that has been provided for the solder bumps 25b, is no longer broken nor comes off in the following process.

Next, a mask 58 is made to make contact with the insulating film 20 (see FIG. 11F). At this time, the mask 50A makes contact with the solder bumps 25b that have been formed on the attaching portions 27b, 27b.... After that, cream solder 61 which includes solder in particle form is applied to one side of the mask 50a and a squeegee 60 is shifted from one side of the mask 50a to the other while pressing the mask 50a with constant pressure (see FIG. 11G). Thus, the cream solder 61 is wiped off using the squeegee 60 while the openings 51a, 51a... in the mask 50a are filled in with the cream solder 61. At this time, the pressure with which the squeegee 60 presses the mask 50a is greater than the pressure with which the squeegee 60 presses the mask 50b in the process shown in FIG. 11B. FIG. 11H shows the state after filling.

After that, the mask 50a making contact with the insulating film 20 is removed. The cream solder 61 with which the openings 51a, 51a . . . in the mask 50a disengages from the openings 51a, 51a . . . so as to stay on the attaching portions 27a, 27a . . . of the insulating film 20. FIG. 11I shows the state where the mask 50 has been removed. Next, the insulating film 20 to which the cream solder 61 is provided is heated in a reflow furnace. Thus, the cream solder is melted and solder bumps 25a, 25a . . . are formed. FIG. 11J shows the state after heating in the reflow furnace.

In the case where the solder bumps 25a, 25a . . . as well as the solder bumps 25b, 25b . . . are formed in accordance with the above described method, a greater amount of cream solder 61 is provided to the attaching portions by increasing the pressing force of the squeegee 60. That is to say, the thickness of the solder bumps 25a, 25a . . . and 25b, 25b . . . can be made approximately the same by adjusting the pressure with which the squeegee 60 places the masks 50a and 50b, respectively.

(Modification 3)

In accordance with the method for forming solder bumps 25a, 25a . . . and solder bumps 25b, 25b . . . according to Modification 3, the same masks 50a and 50b as those used in the forming method according to Modification 2 are used. Solder cream 61 is provided to approximately elliptical attaching portions 27b, 27b . . . in the periphery (peripheral region) of the insulating film 20, and approximately circular attaching portions 27a, 27a . . . in the center portion (inward region) in different steps. The cream solder that is provided to the attaching portions 27b, 27b . . . in the peripheral region using a squeegee 60 in the step shown in FIG. 11B and the cream solder that is provided to the attaching portion 27a, 27a . . . in the inward region using a squeegee 60 in the step shown in FIG. 11G are different as shown in Table 2. That is to say, the diameter of the particles in the solder which forms the cream solder used in the peripheral region is greater than the diameter of the particles in the solder which forms the cream solder used in the inward region.

TABLE 2

| | diameter of solder particles |
|---|---|
| attaching portions 27a in the inward region | 10 to 20 micrometers |
| attaching portion 27b in the peripheral region | 30 to 40 micrometers |

The greater the diameter of the particles in the solder is, the poorer the disengaging properties from the openings in the mask tend to be. Accordingly, the amount of the cream solder 61 which disengages from the openings 51b of the mask 50b where the area of the openings is large can be reduced while the amount of the cream solder 61 which disengages from the openings 51a of the mask 50a where the area of the openings is small can be increased. In other words, the thickness of the formed solder bumps 25a, 25a . . . and solder bumps 25b, 25b . . . can be made approximately the same by selecting cream solder 61 having different particle diameters. Here, the particle diameters of cream solder 61 shown in Table 2 are examples and the invention is not limited to this.

Two or more manufacturing methods from among those shown in the embodiment and Modifications 1 to 3 may be combined to adjust the height of solder bumps 25a, 25a . . . and solder bumps 25b, 25b . . . . Methods may be used, for example, where the particle diameter of cream solder 61 is adjusted as in modification 3, and at the same time the area of the openings 51b of the mask 50b is smaller than the area of the corresponding attaching portions 27b to which solder is provided, or the pressing force of the squeegee 60 is adjusted as in Modification 2, and at the same time the openings 51a in the mask 50a is made of a tapered form.

In addition, the manufacturing processes according to Modifications 2 and 3 include two steps of providing cream solder 61 which sandwich the step of forming solder bumps in reflow processing. The order of these two steps (the step of providing solder to the attaching portions 27a and the step of provided solder to the attaching portions 27b) is not limited to that shown in FIGS. 11A to 11J, but rather, either step may be carried out prior to the other. Furthermore, the two steps may be sequentially carried out in the case where cream solder 61 that has been provided in the prior step is not broken or does not come off in the latter step, and in this case, the reflow processing between the two steps can be omitted.

As this invention may be embodied in several forms without departing from the spirit of essential characteristics thereof, the present embodiments are therefore illustrative and not restricted, since the scope of the invention is defined by the appended claims rather than by description preceding them, and all changes that fall within metes and bounds of the claims, or equivalence of such metes and bounds thereof are therefore intended to be embraced by the claims.

What is claimed is:

1. A wiring board, comprising:
an insulating film;
a plurality of wires provided on one surface of the insulating film; and
a plurality of through holes created in said insulating film, wherein a portion of each wire is exposed from the other surface of the insulating film through the corresponding through hole, the portions of the wires exposed through said through holes correspond to attaching portions for attaching conductive brazing material in a bump form thereto, the attaching portions comprise at least one first attaching portion disposed in a peripheral region of the insulating film and at least one second attaching portion disposed in an inward region of the insulating film, and an area of each of the at least one first attaching portion to which a conductive brazing material is attached and exposed is greater than an area of each of the at least one second attaching portion to which a conductive brazing material is attached and exposed, and wherein the at least one second attaching portion comprises a plurality of attaching portions which are disposed in a substantially rectangular region formed in the inward region of said insulating film, the plurality of wires in said insulating film extend across one side of said substantially rectangular region, the at least one first attaching portion comprises at least two rows of attaching portions which are disposed in the peripheral region of said insulating film and parallel to one another in a direction in which the wires in said insulating film extend, and the at least two rows of attaching portions are adjacent to four corners of said substantially rectangular region and surround said substantially rectangular region from the outside thereof.

2. The wiring board according to claim 1, wherein a thickness of conductive brazing material attached to the at least one first attaching portion is substantially the same as a thickness of conductive brazing material attached to the at least one second attaching portion.

3. The wiring board according to claim 2, wherein a substantially rectangular region where a plurality of circular attaching portions are provided is formed in the inward region of said insulating film, the wires of said insulating film extend so as to cross one side of said substantially rectangular region, at least two lines of a plurality of elliptical attaching portions are provided in the peripheral region of said insulating film, being parallel to one another in a direction in which the wires of said insulating film extend, and the at least two lines of the elliptical attaching portions are adjacent to four corners of said substantially rectangular region and surrounding said substantially rectangular region from the outside thereof.

4. The wiring board according to claim 1, wherein the plurality of wires comprise a grounding wire configured to supply a grounding potential, the grounding wire extends along the periphery of said insulating film and surrounds the inward region, and the at least two rows of attaching portions of the at least one first attaching portion correspond to the extension of the grounding wire.

5. The wiring board according to claim 1, wherein the at least two rows of attaching portions of the at least one first attaching portion surround the substantially rectangular region from the three sides thereof.

6. A wiring board, comprising:
an insulating film; a plurality of wires provided on one surface of the insulating film, each wire including a terminal land; and
a plurality of attaching portions for attaching conductive brazing material in a bump form thereto which are provided on the surface of said insulating film, each attaching portion making up the terminal land, wherein said attaching portions comprise at least one first attaching portion disposed in a peripheral region of the insulating film and at least one second attaching portion disposed in an inward region of the insulating film, and an area of each of the at least one first attaching portion to which a conductive brazing material is attached and exposed is greater than an area of each of the at least one second attaching portion to which a conductive brazing material is attached and exposed, and wherein the at least one second attaching portion comprises a plurality of attaching portions which are disposed in a substantially rectangular region formed in the inward region of said insulating film, the plurality of wires in said insulating film extend across one side of said substantially rectangular region, the at least one first attaching portion comprises at least two rows of attaching portions which are disposed in the peripheral region of said insulating film and parallel to one another in a direction in which the wires in said insulating film extend, and the at least two rows of attaching portions are adjacent to four corners of said substantially rectangular region and surround said substantially rectangular region from the outside thereof.

7. The wiring board according to claim 6, wherein the plurality of wires comprise a grounding wire configured to supply a grounding potential, the grounding wire extends along the periphery of said insulating film and surrounds the inward region, and the at least two rows of attaching portions of the at least one first attaching portion correspond to the extension of the grounding wire.

8. The wiring board according to claim 6, wherein the at least two rows of attaching portions of the at least one first attaching portion surround the substantially rectangular region from the three sides thereof.

9. The wiring board according to claim 6, wherein a thickness of conductive brazing material attached to the at least one first attaching portion is substantially the same as a thickness of conductive brazing material attached to the at least one second attaching portion.

* * * * *